(12) United States Patent
Wu et al.

(10) Patent No.: US 7,356,434 B2
(45) Date of Patent: Apr. 8, 2008

(54) METHOD OF SPECIFYING PIN STATES FOR A MEMORY CHIP

(75) Inventors: Jeremy Wu, Xindian (TW); Yu Jen Chen, Pan-Chiao (TW); Huan An Wu, Sinfong Township, Hsinchu County (TW); Wei-Chia Cheng, Marietta, GA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 520 days.

(21) Appl. No.: 11/127,451

(22) Filed: May 12, 2005

(65) Prior Publication Data

US 2006/0256602 A1    Nov. 16, 2006

(51) Int. Cl.
*G06F 19/00* (2006.01)
(52) U.S. Cl. ...................................... 702/118; 714/725
(58) Field of Classification Search ................ 702/118, 702/117, 182–185, 188; 714/14, 25, 725
See application file for complete search history.

(56) References Cited

U.S. PATENT DOCUMENTS 6,694,464 B1 *   2/2004   Quayle et al. .............. 714/725

\* cited by examiner

*Primary Examiner*—Edward Raymond
(74) *Attorney, Agent, or Firm*—Kirkpatrick & Lockhart Preston Gates Ellis LLP

(57) ABSTRACT

This invention discloses a method of specifying pin states for a memory chip having one or more pins. In one embodiment of the invention, the pins are prioritized to obtain a pin order, wherein the pin state of a pin of a higher order dominates the pin state of a pin of a lower order. A number of possible combinations of the pin states are generated for the pins based on the pin order. The possible combinations are presented using a data presentation format. At least one pin of a higher order dominates at least one pin of a lower order when the at least one pin of a higher order is set in a predetermined pin state, such that the number of the possible combinations presented is reduced by neglecting combinations generated by the pins states of the dominated pins.

20 Claims, 3 Drawing Sheets

METHOD OF SPECIFYING PIN STATES FOR A MEMORY CHIP

BACKGROUND

The present invention relates generally to memory chips, and more particularly to a systematic approach to fully specify the memory chip's behaviors.

A memory chip has a number of pins of various functions. For example, a conventional single-port static random access memory (SRAM) has a variety of pins, such as the synchronous clock (CLK) pin, chip-enable (CE) pin, read-write (WE) control pin, address (A) pin, and data input (D) pin. The CLK, CE, WE, A and D pins receive input signals that affect the memory chip's behaviors. It is desirable to provide an intellectual property (IP) library that specifies how the signal states of the pins affect the memory chip's behaviors.

A pin of a memory chip can be in a normal or abnormal state. The normal states include high and low signals, which usually represent logic "1" and "0," respectively. The abnormal state includes exceptional states, such as unknown and high impedance states, and timing violation states. Conventionally, an IP library of a memory chip only specifies the normal states for the pins and their corresponding memory chip behaviors. Neither the exceptional nor the timing violation states are specified for the pins in the conventional IP library. This has certain drawbacks.

One of the drawbacks is the negative impression a customer may have on a memory chip provider. When the memory chip provider sells a memory chip to the customer, it usually comes with a specification of the memory chip behaviors. The customer who may be a circuit designer usually relies on the specification for designing his own products. In certain situations of circuit designs, the abnormal pin states and their corresponding memory chip's behaviors need to be specified. Because the conventional IP library of a memory chip does not provide information with respect to the abnormal states, the customer needs to specify those states on his own. Moreover, different customers may define the memory chip's behaviors differently. This creates undesirable confusion.

Another drawback of lacking the abnormal states specified in the conventional IP library of a memory chip is the confusion among the engineers of the chip provider. An IP library design process may involve various types of engineers, such as customer application engineers (CAE), computer aided design (CAD) engineers, design engineers and quality control (QC) engineers. A QC engineer may have different definitions for unspecified memory chip behaviors than a simulation model design engineer. This causes confusion when comparing the simulated modules with the memory chip's true behaviors.

Therefore, desirable in the art of memory designs are methods for systematically specifying pin states and defining their corresponding memory behaviors for a memory chip.

SUMMARY

This invention discloses a method of specifying pin states for a memory chip having one or more pins. In one embodiment of the invention, the pins are prioritized to obtain a pin order, wherein the pin state of a pin of a higher order dominates the pin state of a pin of a lower order. A number of possible combinations of the pin states are generated for the pins based on the pin order. The possible combinations are presented using a data presentation format. At least one pin of a higher order dominates at least one pin of a lower order when the at least one pin of a higher order is set in a predetermined pin state, such that the number of the possible combinations presented is reduced by neglecting combinations generated by the pins states of the dominated pins.

The construction and method of operation of the invention, however, together with additional objects and advantages thereof will be best understood from the following description of specific embodiments when read in connection with the accompanying drawings.

DESCRIPTION

This method provides a systematic approach to specify all the possible combinations of the pin states, including the normal states and abnormal states, such as exceptional and timing violation states, for a memory chip. A systematic approach is important because this helps to reduce the actual number of possible combinations of pin states needed for providing a full specification of memory behaviors. For example, specifying four different states, such as a high state, low state, unknown state, and high impedance state, for a memory chip with seven input pins takes 16348 or $4^7$, combinations, if no systematic approach is used to reduce the total number of the possible combinations. This present method is able to provide a specification of a memory chip's behaviors with a reduced number of the possible combinations of the pin states.

Figure 1:
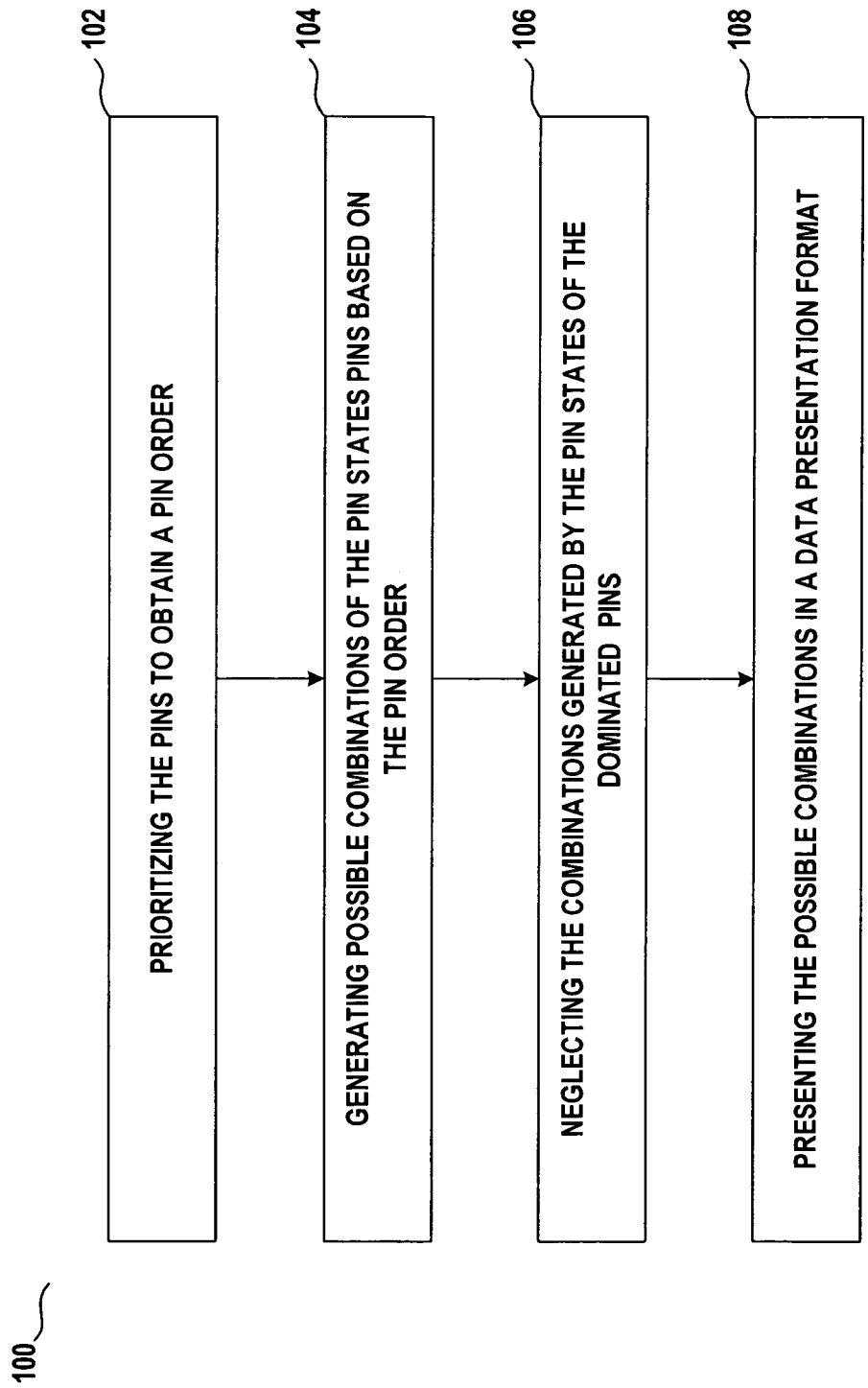
FIG. 1 illustrates a flow chart showing a method for systematically specifying the pin states of a memory chip in accordance with one embodiment of the present invention.

FIG. 1 illustrates a flow chart 100 showing a method for specifying the pin states for a memory chip in accordance with one embodiment of the present invention. In step 102, the pins of a memory chip are prioritized to obtain a pin order based on their importance, wherein the pin state of a higher order dominates the pin state of a lower order. Take a single port SRAM having CLK, CE, WE, A and D pins as an example. When the CE (chip enable) pin is set to be "0," no further consideration for the pins such as WE, A and D are necessary. Because when CE pin is set to be "0," the chip is disabled and the states of the pins WE, A and D will not affect the memory chip's behaviors. Therefore, the CE pin is considered as having a higher priority than the other pins. The importance of each pin can be determined collectively by a group of engineers, such as CAE engineers, CAD engineers, design engineers and QC engineers.

In step 104, the possible combinations of the pin states are generated based on the pin order. The pin states are examined for each one of the pins from the highest order to the lowest order. At least one pin of a higher order dominates at least one pin of a lower order, when the pin of the higher order is provided with a predetermined pin state. When the state of the higher order pin is determined, the states of the lower order pins dominated thereby need no further consideration. In some cases, if the state of one pin is determined, the states of the rest of the lower order pins can be neglected. In other cases, the states of two or more pins need to be determined to dominate the rest of the pins following these pins.

In step 106, the combinations generated by the states of the dominated pins are neglected. This reduces the total number of possible combinations of the pin states for a memory chip. For example, a single port SRAM has a pin order of CLK, CE, WE, A and D, from the highest order to the lowest order. When the CLK pin is set to be in an exceptional state, it dominates CE, WE, A and D pins. Therefore, the combinations generated by examining the states of these pins can be neglected. If each pin has four states, 256, or $4^4$, combinations can be neglected. This makes it practical and efficient for engineers to include the abnormal states, such as the exceptional and timing violation states, in the IP library of a memory chip.

In step 108, the possible combinations are presented in a data presentation format, such as a truth table, state-based pin-function relation diagram or pin-based state diagram. The following is an example of how the combinations of the pin states can be presented in a truth table format:

TABLE 1

| Inputs | | | | | | Outputs | |
|---|---|---|---|---|---|---|---|
| CLK | CE | WE | A | BWE | D | MEM | DOUT |
| X/Z | X/Z | — | — | — | — | All X | X |
| X/Z | 1 | — | — | — | — | All X | X |
| L->H | X/Z | — | — | — | — | All X | X |
| L->H | 1 | X/Z | X/Z | — | — | All X | X |
| L->H | 1 | X/Z | Valid | — | — | X | X |
| L->H | 1 | 0 | X/Z | — | — | Hold | X |
| L->H | 1 | 1 | X/Z | — | — | All X | Hold |
| L->H | 1 | 0 | Valid | — | — | Hold | Data-out |
| L->H | 1 | 1 | Valid | X/Z | — | X | Hold |
| L->H | 1 | 1 | Valid | Valid | X/Z | Data-in | Hold |

As shown above, the exemplary memory chip has six pins, CLK, CE, WE, A, BWE and D, with four possible states for a given pin at any given time: high (1), low (0), unknown (X), and high impedance (Z). This truth table only shows a part of all the possible combinations with emphasis on how to specify exceptional pin states for the memory chip. Based on discussions of various types of engineers, the pin order is determined as CLK, CE, WE, A, BWE and D, from the highest order to the lowest order. These pins are listed as the columns in the truth table from the left to the right according to the pin order. The two columns MEM and DOUT at the right represent the memory content and output data, respectively. Note that while the output data DOUT is conventional in a standard truth table, the memory content MEM is not usually seen. However, it is imperative to have MEM in the specification because the model design engineer needs it to fully reflect the behavior of a memory system.

Each row of the table represents a combination of the pin states. For each row, the CLK pin is firstly provided with a pin state. If the pin state of CLK does not dominate the pins following it, the CE pin is then provided with a pin state. The same process goes on for pins WE, A, BWE and D. When one row is done, the process repeats for the next row until a full set of the combinations is presented.

In the first row, the CLK pin is provided with a state of unknown or high impedance, and the CE pin is provided with a "1" state. These two states of the two pins dominate the rest of the pins WE, A, BWE and D, and all of the memory addresses are defined as unknown, and the output data are also defined as unknown. In the second row, the CLK pin is provided with a state of unknown or high impedance, and the CE pin is also provided with a state of unknown or high impedance. These two states of the two pins dominate the rest of the pins WE, A, BWE and D, and all of the memory addresses are defined as unknown, and the output data are also defined as unknown. If the same result is observed when the CE pin is in the state of "0", then these three cases may be merged to form a single row, and the CLK pin dominates the rest of the pins. However, because the chip is disabled when the CE pin is in the "0" state, the first two rows must be kept separate.

In the third row, the CLK is provided with a state of low-to-high, which does not dominate the rest of the pins. The CE pin is then provided with a state of unknown or high impedance, which dominates the rest of the pins. In this case, all of the memory addresses are defined as unknown, and the output data are also defined as unknown.

In the fourth row, the CLK is provided with a state of low-to-high. The CE pin is provided with a "1" state, and the WE pin is provided with a state of unknown or high impedance. When the A pin is provided with a state of unknown or high impedance, the BWE and D pins are dominated. In this case, all of the memory addresses and output data are defined as unknown. In the fifth row, when the A pin is provided with a valid state indicating a particular address, the BWE and D pins are dominated. In this case, that particular memory address is defined as unknown and the output data are also defined as unknown. The fourth and fifth rows show that the pin states of WE and A need to be determined first to dominate the rest of the pins and define the memory content and output data. Therefore, the two rows need to be separated.

Whether one or more pins dominate other pins is determined collectively by a predetermined group of engineers. It can be observed from the table that the pin states are expanded from the top-left corner to the bottom-right corner in a shape resembling a "downward stair." This method provides a systematic approach to specify the pin states, including the normal and abnormal states, with a reduced number of possible combinations of the pin states.

Figure 2:
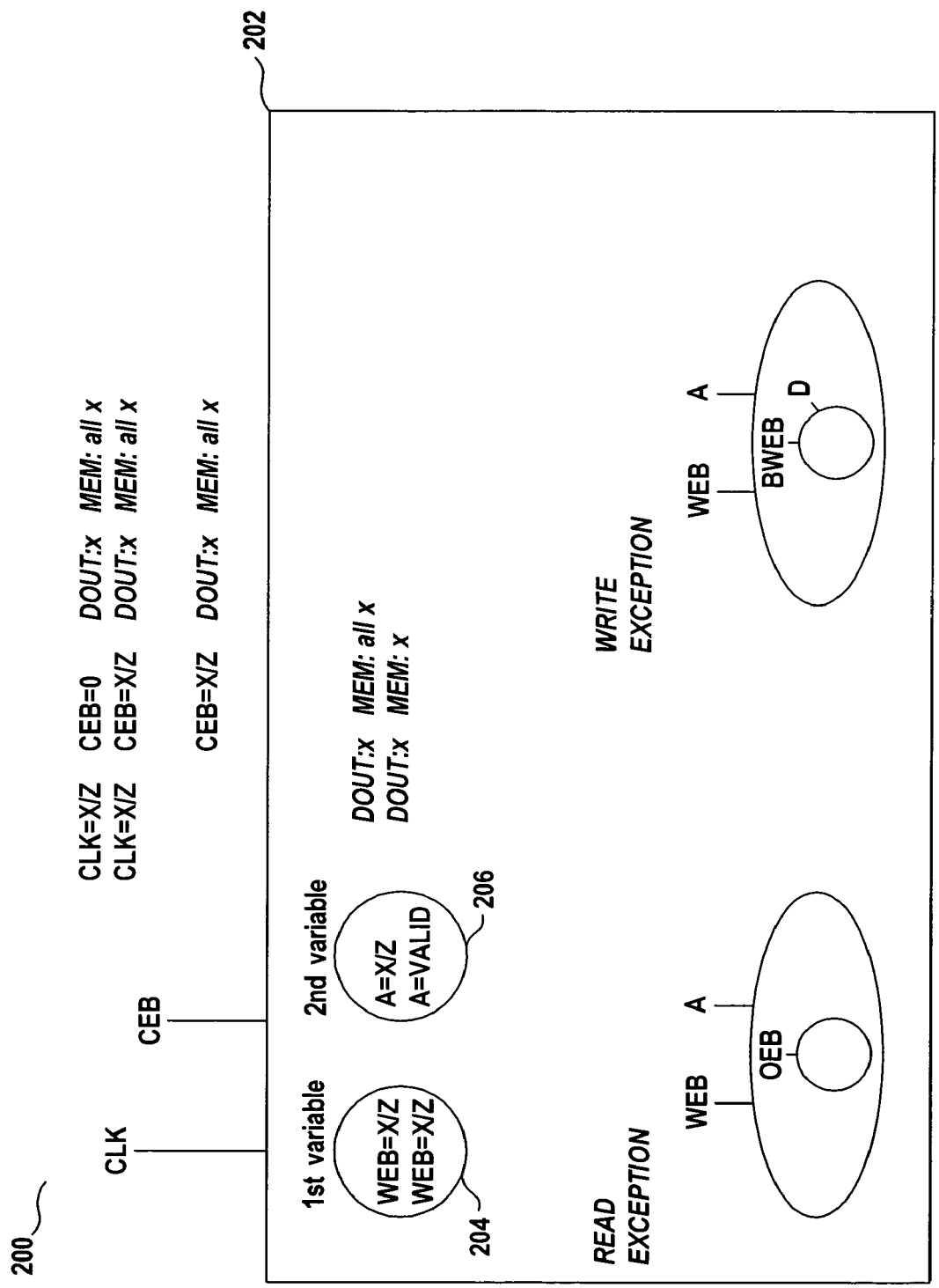
FIG. 2 illustrates a state-based pin function relation diagram presenting the possible combinations of the pin states versus the pins using the method in accordance with the embodiment of the present invention.

FIG. 2 illustrates an exemplary state-based pin-function relation diagram 200 as a data presentation format for presenting the possible combinations of the pin states generated by using the method according to the above described embodiment. The state-based pin-function relation diagram has a number of shapes and lines geometrically arranged for representing the pins in accordance with the pin order. From the outside of the square 202 to the inside of the same, the pins CLK, CEB, WEB, A, BWEB and D are arranged based on the pin order. The externally-located pins dominate the internally-located pins. For example, when the pin CLK is provided with a state of unknown or high impedance, all of the memory addresses are defined as unknown and the output data are also defined as unknown. When the pin CEB is provided with a state of unknown or high impedance, all of the memory addresses are defined as unknown and the output data are defined as unknown. The circles 204 and 206 represent the pin states of the WEB and A pins. When WEB and A are unknown/high-impedance, all the memory addresses and output data are set to be unknown. When WEB is unknown/high-impedance and A is valid, a particular memory address is set to be unknown, and the output data are also set to be unknown.

Figure 3:
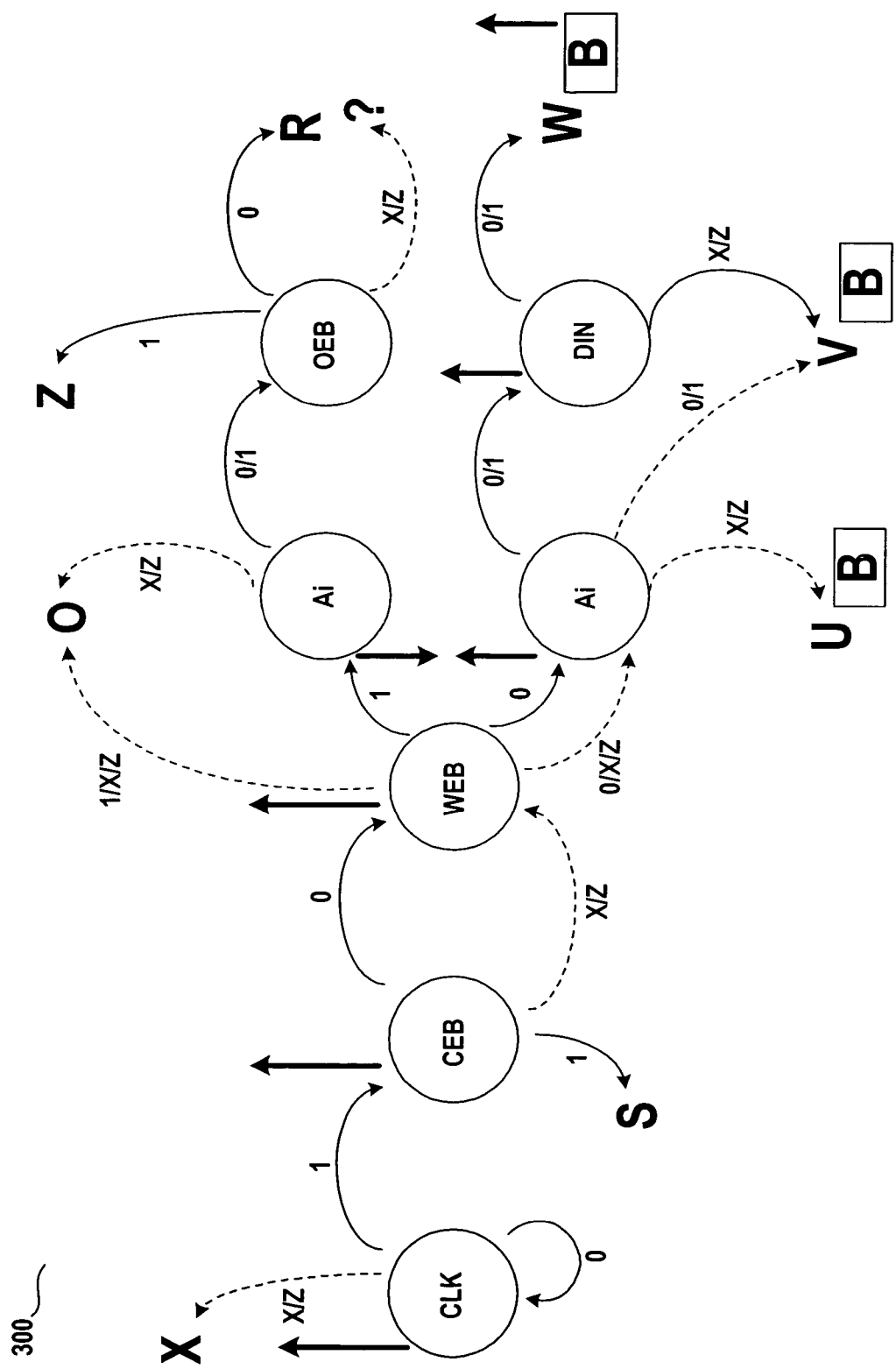
FIG. 3 illustrates a pin-based state diagram presenting the possible combinations of the pin states versus the pins using the method in accordance with the embodiment of the present invention.

FIG. 3 illustrates an exemplary pin-based state diagram 300 as a data presentation format for presenting the possible combinations of the pin states generated by using the method according to the above described embodiment. The pin-based state diagram has many circles representing the pins according to the pin order from the left to the right. The double-lined arrows represent the timing violation situations. The solid single-lined arrows show that the pins are set to a normal state, such as logic "0" or "1." The arrows with dashed lines show that the pins are in an exceptional state. The letters represent various situations and are explained in the following table:

TABLE 2

| Normal State | Abnormal State |
|---|---|
| R - Read | O - Output Unknown |
| W - Write + B | X - Store Unknown to All Addresses + O |
| S - Stand by | U - Store Unknown to All Addresses + B |
| Z - High Impedance | V - Store Unknown to the Valid Address + B |
| | B - Retain Bits where BWEBj is high |

The above embodiments and examples provide a systematic approach to fully specify functionality of a memory IP. The exceptional and timing violation states are involved in this full specification. This helps to improve a memory chip provider's service for a customer. This also helps to avoid confusion among engineers. The systematic approach reduces the possible combinations of pin states versus pin. Therefore, it is practical and efficient to fully specify the functionality of a memory IP using the disclosed method.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method of specifying pin states for a memory chip having one or more pins, comprising:
   prioritizing the pins to obtain a pin order, wherein the pin state of a pin of a higher order dominates the pin state of a pin of a lower order;
   generating a number of possible combinations of the pin states for the pins based on the pin order;
   presenting the possible combinations using a data presentation format,
   wherein at least one pin of a higher order dominates at least one pin of a lower order when the at least one pin of a higher order is set in a predetermined pin state, such that the number of the possible combinations presented is reduced by neglecting combinations generated by the pins states of the dominated pins.

2. The method of claim 1 wherein the pin states include an exceptional state and a timing violation state.

3. The method of claim 2 wherein the exceptional state includes an unknown state and a high impedance state.

4. The method of claim 1 wherein the step of generating a number of possible combinations further comprises:
   examining the pin states for each one of the pins according to the pin order; and
   neglecting examination of the pin states of the dominated pins.

5. The method of claim 1 wherein a plurality of the pins of a higher order are required to dominate the pins of a lower order.

6. The method of claim 1 wherein the data presentation format is a truth table having the pin states arranged as rows, and the pins arranged as columns in accordance with the pin order.

7. The method of claim 6 wherein the truth table further comprises a memory content column and a data output column.

8. The method of claim 1 wherein the data presentation format is a state-based pin-function relation diagram having a number of shapes and lines geometrically arranged for representing the pins in accordance with the pin order.

9. The method of claim 1 wherein the data presentation format is a pin-based state diagram.

10. The method of claim 1 wherein the pins include synchronous clock pin, chip enable pin, read-write enable pin, address pin, and data-input pin.

11. A method of specifying pin states for a memory chip having one or more pins, comprising:
    prioritizing the pins to obtain a pin order, wherein the pin state of a pin of a higher order dominates the pin state of a pin of a lower order;
    examining the pin states for each one of the pins according to the pin order for generating a number of possible combinations of the pin states;
    neglecting examination of the pin states for at least one pin of a lower order that is dominated by at least one pin of a higher order, when the at least one pin of a higher order is set in a predetermined pin state;
    presenting the possible combinations using a data presentation format,
    wherein the number of the possible combinations presented is reduced by neglecting combinations generated by the pins states of the dominated pins.

12. The method of claim 11 wherein the pin states include an exceptional sate, and a timing violation state.

13. The method of claim 12 wherein the exceptional state includes an unknown state and a high impedance state.

14. The method of claim 11 wherein a plurality of pins of a higher order are required to dominate the pins of a lower order.

15. The method of claim 11 wherein the data presentation format is a truth table having the pin states arranged as rows, and the pins arranged as columns in accordance with the pin order.

16. The method of claim 11 wherein the data presentation format is a state-based pin-function relation diagram having a number of shapes and lines geometrically arranged for representing the pins in accordance with the pin order.

17. The method of claim 11 wherein the data presentation format is a pin-based state diagram.

18. A method of specifying pin states for a memory chip having one or more pins, comprising:
    prioritizing the pins to obtain a pin order, wherein the pin state of a pin of a higher state dominates the pin state of a pin of a lower order;
    examining the pin states for each one of the pins according to the pin order for generating a number of possible combinations of the pin states for the pins;
    neglecting examination of the pin states for at least one pin of a lower state that is dominated by at least one pin of a higher state, when the at least one pin of a higher state is set in a predetermined pin state;

presenting the possible combinations using a truth table with the pins arranged as columns based on the pin order and the pin states as rows, each of which represents one of the possible combinations, wherein the number of the possible combinations presented is reduced by neglecting combinations generated by the pins states of the dominated pins.

19. The method of claim 18 wherein the pin states include an exceptional sate and a timing violation state.

20. The method of claim 18 wherein one or more pins of a higher order are required to dominate the pins of a lower order.

* * * * *